(12) United States Patent
Yardibi et al.

(10) Patent No.: US 9,964,625 B2
(45) Date of Patent: May 8, 2018

(54) ELECTRICAL SUBSTATION FAULT MONITORING AND DIAGNOSTICS

(75) Inventors: Tarik Yardibi, Schenectady, NY (US);
Meena Ganesh, Clifton Park, NY (US);
Timothy Lee Johnson, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 322 days.

(21) Appl. No.: 13/169,220

(22) Filed: Jun. 27, 2011

(65) Prior Publication Data
US 2012/0327745 A1   Dec. 27, 2012

(51) Int. Cl.
*G01S 3/80* (2006.01)
*G01S 5/18* (2006.01)
*G01R 31/12* (2006.01)

(52) U.S. Cl.
CPC ............ *G01S 3/80* (2013.01); *G01R 31/1209* (2013.01); *G01S 5/18* (2013.01)

(58) Field of Classification Search
USPC ......................................................... 367/121
See application file for complete search history.

(56) References Cited

U.S. PATENT DOCUMENTS

| | | | |
|---|---|---|---|
| 5,627,800 A * | 5/1997 | Kotler et al. ................. | 367/127 |
| 6,327,220 B1 * | 12/2001 | Miller et al. .................. | 367/134 |
| 7,148,696 B2 | 12/2006 | Zhou et al. | |
| 7,336,562 B1 * | 2/2008 | Hoyle et al. .................... | 367/25 |
| 7,403,129 B2 | 7/2008 | Zhou et al. | |
| 7,411,403 B2 | 8/2008 | Zhou | |
| 7,746,055 B2 | 6/2010 | Bose et al. | |
| 2001/0045829 A1 * | 11/2001 | Prammer et al. ............. | 324/303 |
| 2002/0163335 A1 * | 11/2002 | Prammer et al. ............. | 324/303 |

(Continued)

FOREIGN PATENT DOCUMENTS

| | | |
|---|---|---|
| EP | 0707205 A2 | 4/1996 |
| EP | 1686673 A1 | 8/2006 |
| WO | 9724742 A1 | 7/1997 |

OTHER PUBLICATIONS

F. Brikci, "Vibro-Acoustic Testing applied to Tap Changers and to Circuit Breakers," Tech Con 2010, Sydney, Australia, pp. 1-28.

(Continued)

*Primary Examiner* — James R Hulka
(74) *Attorney, Agent, or Firm* — Ziolkowaki Patent Solutions Group, SC; Jean K. Testa

(57) ABSTRACT

A fault monitoring system for an electrical substation includes one or more arrays of acoustic sensors placed around a substation boundary and configured to measure acoustic pressure waves. A processing circuitry in the fault monitoring system localizes and identifies faults in the substation and includes a sound source localization module to identify an area of a sound source based on the acoustic pressure waves. A beamforming module of processing circuitry provides enhanced acoustic pressure waves by eliminating background noise and interfering noise from the acoustic pressure waves and a component signature classification module in the processing circuitry compares enhanced acoustic pressure waves with component signatures to classify the acoustic pressure waves into various events to detect faults in the electrical substation.

24 Claims, 4 Drawing Sheets

(56) References Cited

U.S. PATENT DOCUMENTS

| | | | |
|---|---|---|---|
| 2004/0120532 A1* | 6/2004 | Dedieu et al. | 381/92 |
| 2004/0124837 A1* | 7/2004 | Prammer et al. | 324/303 |
| 2004/0151578 A1* | 8/2004 | Wobben | 415/4.1 |
| 2006/0164097 A1* | 7/2006 | Zhou et al. | 324/529 |
| 2006/0254355 A1* | 11/2006 | Zhou | 73/579 |
| 2007/0263329 A1* | 11/2007 | Zhou et al. | 361/42 |
| 2007/0268782 A1* | 11/2007 | Pabon et al. | 367/31 |
| 2008/0167877 A1 | 7/2008 | McAllister et al. | |
| 2008/0285772 A1* | 11/2008 | Haulick et al. | 381/92 |
| 2010/0090683 A1* | 4/2010 | Bose et al. | 324/117 H |
| 2010/0280773 A1 | 11/2010 | Saether | |
| 2011/0012603 A1* | 1/2011 | Bose et al. | 324/418 |

OTHER PUBLICATIONS

B. R. Varlow et al., "Acoustic emission analysis of high voltage insulation," Non-Destructive diagnostics of Insulating Systems, IEE Proceedings, Science, Measurement and Technology, vol. 146, No. 5, Sep. 1999, pp. 260-263.

J. Zhao et al., "Substation monitoring by acoustic emission techniques," IEE Proceedings, Science, Measurement Technology, vol. 148, No. 1, Jan. 2001, pp. 28-34.

GB Search Report dated Sep. 18, 2012 issued in connection with corresponding Application No. GB1210969.0. dated Sep. 18, 2012.

* cited by examiner

ELECTRICAL SUBSTATION FAULT MONITORING AND DIAGNOSTICS

BACKGROUND

The invention relates generally to electrical substations and more specifically to fault monitoring and diagnostics in electrical substations.

Electrical substations are an important component of the electrical power distribution system. Substations typically include a number of assets such as transformers, circuit breakers, substation batteries and battery chargers, capacitor banks, and underground cables, to name but a few. Optimizing the maintenance, repair, and replacement of these and other assets is a challenging task, particularly when system reliability is taken into consideration.

Most of the substation assets are high-voltage structures which deteriorate with time. There is a significant economic benefit in being able to selectively identify and replace those assets that have deteriorated significantly. The principal mechanisms that are responsible for the long-term degradation of these assets are erosion and cracking within or on the surface of the insulation. Thus, in the long term, monitoring the condition of these assets assists in the planning of asset replacement. More immediately it enables suspect components to be identified and replaced which extends the lives of assets.

The state of the art in substation inspection is manual inspection by trained personnel, usually performed about once a year. During manual inspection, human auditory assessment is usually employed, but it cannot cover the frequency range of digital equipment, and further it cannot be used for 24×7 surveillance. Infrared imaging is also an effective wide-area assessment method, but it has higher power requirements and is costly.

Therefore, there is a need for an improved substation fault monitoring and diagnostics system and method to address one or more aforementioned issues.

BRIEF DESCRIPTION

In accordance with an embodiment of the present invention, a fault monitoring system for an electrical substation is provided. The fault monitoring system includes one or more arrays of acoustic sensors placed around a substation boundary and configured to measure acoustic pressure waves and a processing circuitry configured to localize and identify faults in the substation. The processing circuitry includes a sound source localization module to identify an area of a sound source based on the acoustic pressure waves, a beamforming module to provide enhanced acoustic pressure waves by eliminating background noise and an interfering noise from the acoustic pressure waves, and a component signature classification module to compare enhanced acoustic pressure waves with component signatures to classify the acoustic pressure waves into various events to detect faults in the electrical substation.

In accordance with another embodiment of the present invention, a method for monitoring faults in an electrical substation is provided. The method includes acquiring acoustic pressure waves from acoustic sensor arrays placed around a substation boundary and localizing an area of a sound source based on a localization algorithm. The method further includes removing a background noise and an interfering noise from the acoustic pressure waves and generating enhanced acoustic pressure waves based on a beamforming algorithm and classifying enhanced acoustic pressure waves into various events by comparing the enhanced acoustic pressure waves with component signatures to detect faults in the electrical substation.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Figure 1:
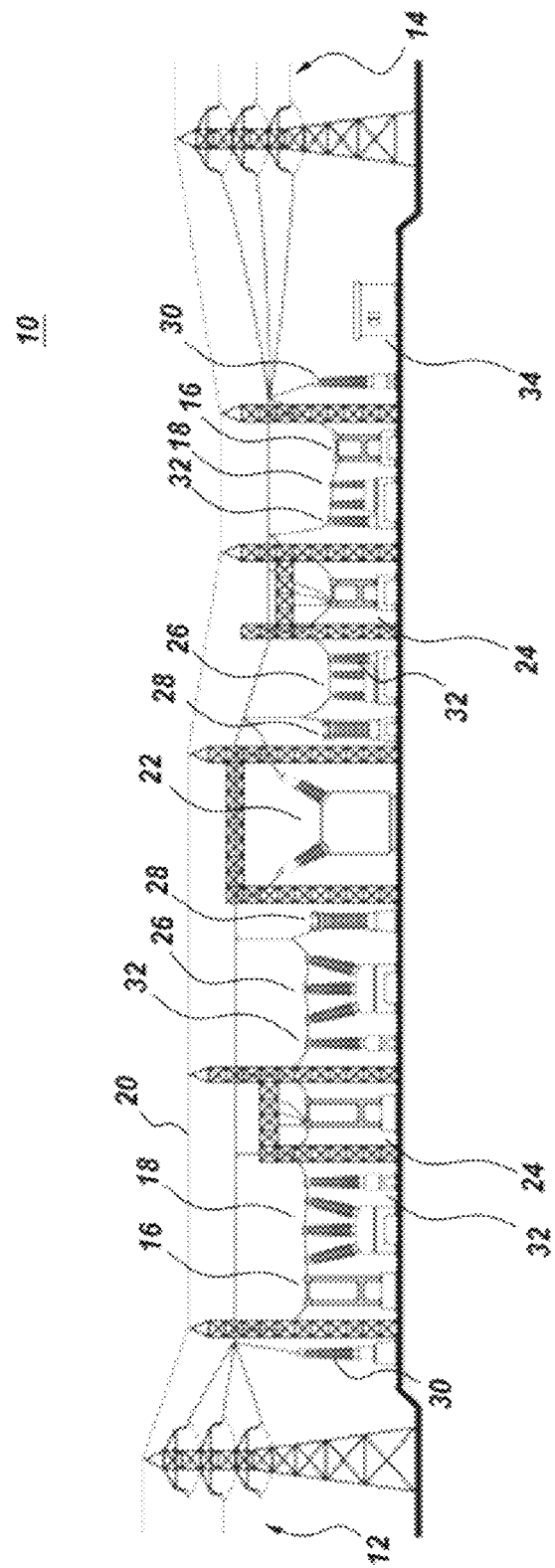
FIG. 1 is a diagrammatical representation of a conventional substation utilized in an electric power system.

FIG. 1 shows a conventional substation 10 utilized in any electric power system. Bulk electric power at high voltages is fed into the substation 10 by high voltage or extra high voltage three phase AC transmission lines 12 (having a voltage of typically between 69 kV and 765 kV). The high voltage or extra high voltage is reduced by the substation 10 to a voltage which is suitable for distribution via one or more power lines 14, typically at a voltage of between 4 kV and 46 kV, depending on the implementation. The power lines 14 can, for example, serve as the primary feeders of a utility's distribution grid. A ground wire 20 in substation 10 shields main conductors 12 and 14 from direct lightning strikes.

Within the substation 10, the high voltage transmission lines 12 are terminated by a disconnect switch 16 and a circuit breaker 18 connected in series, with the circuit breaker 18 being in turn attached to a bus bar (not shown). A similar configuration of disconnect switch and circuit breakers is also used on low voltage power lines 14. Circuit breakers 18 are used to interrupt any short circuits or overload currents that may occur on the network whereas disconnect switches 16 are used to provide isolation to conductors and other assets for maintenance purposes.

In order to reduce the voltage to the lower levels which are suitable for distribution via the power lines 14, the high voltage or extra high voltage electricity is fed into a power transformer 22 via a further disconnect switch 24 and circuit breaker 26 pair. Additionally, a lightening arrester 28 is typically provided on both sides of transformer 22 for the grounding of the excessively high voltages that are caused by lightning strikes and other system problems. Potential transformers 30 and current transformers 32 may be utilized in substation 10 for measuring voltages and currents at various points. A control room 34 may house control and metering instruments for operating transformer, circuit breakers and disconnect switches along with batteries to provide backup power.

Over the years like any other apparatus, the substation assets may also deteriorate. For example, transformers may develop faults like degradation of iron core because of heat, partial discharge in a winding insulation, a bushing or a transformer oil, and corrosion or friction on a tap changer. There may be similar defects that develop in other assets such as circuit breakers, cable boxes, lightning arresters, etc. To detect these faults and ensure smooth operation, various sensors such as acoustic sensors, optical sensors, thermal sensors, and pressure sensors may be employed on each of the substation asset to detect faults in those assets. In one embodiment of the present invention, an overall substation monitoring system based on acoustic sensors is provided.

Figure 2:
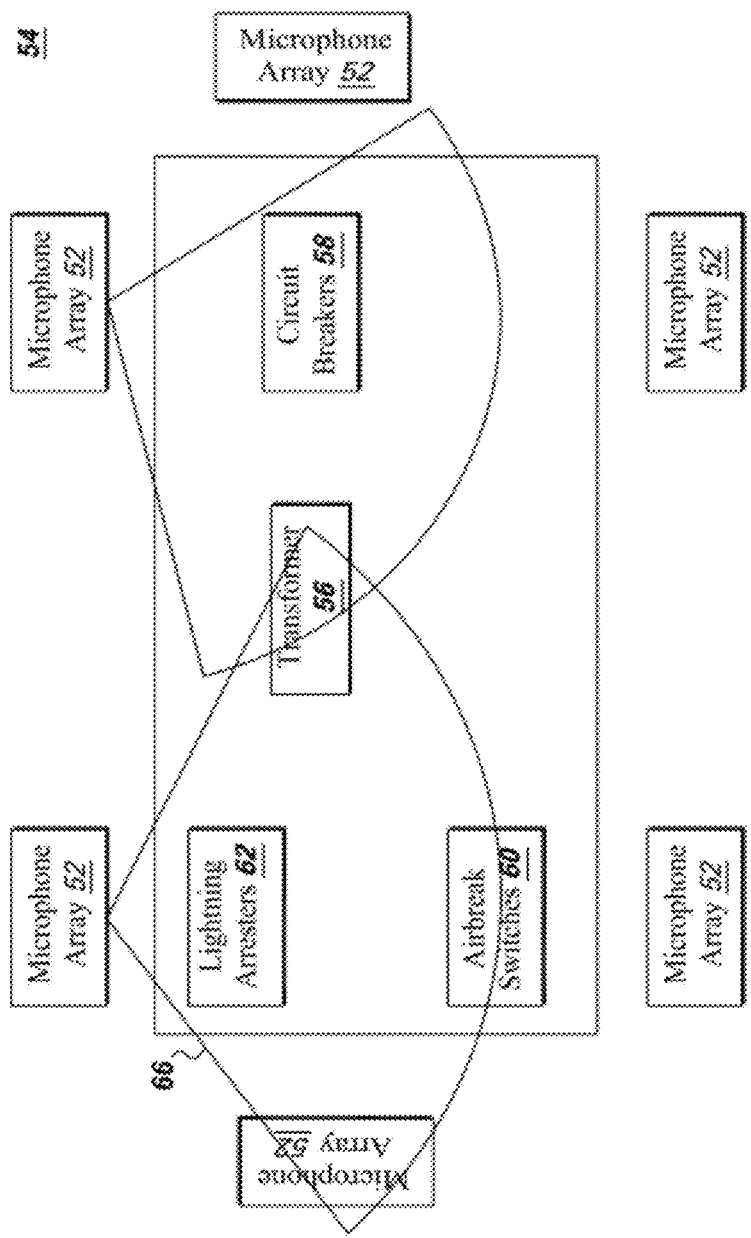
FIG. 2 is a diagrammatical representation of a placement of one or more acoustic sensor arrays in a substation in accordance with an embodiment of the present invention.

FIG. 2 shows a schematic of a placement of one or more acoustic sensor arrays 52 in a substation 54 in accordance with an embodiment of the present invention. An acoustic sensor may be a microphone which converts substation sound waves or acoustic pressure waves into digitized signals. The microphone may measure audible range frequencies and beyond. The microphone may depend on an electromagnetic induction principle, capacitance change principle, piezoelectric effect or light modulation to produce an electrical voltage signal from mechanical vibration. As discussed earlier, the substation 54 may include assets such as transformer 56, circuit breakers 58, air-break switches 60 and lightning arresters 62. In one embodiment, acoustic sensor arrays 52 comprising multiple acoustic sensors may be placed all around the substation boundary 64. The acoustic sensor arrays may be placed uniformly over a substation boundary or may be placed with a variable pitch. In another embodiment, the boundary may be an overall substation area boundary. In yet another embodiment, the boundary may be formed by substation assets (i.e., if there are no assets in a particular area of the substation, the boundary may be reduced to encapsulate only the area near the assets). For example, if a particular transformer is 100 meters inside the substation boundary and in between the substation boundary and the transformer there are no other assets then the boundary may be reduced by 100 meters. Each of acoustic sensor arrays 52, as a standalone unit, records acoustic measurements and algorithmically focuses on a particular zone 66 to create its own audio profile. This audio profile is then analyzed to determine the location and type of fault in substation 54. In some embodiments, additional sensor arrays (not shown) dedicated to monitor faults in a particular asset may also be placed near that asset.

Figure 3:
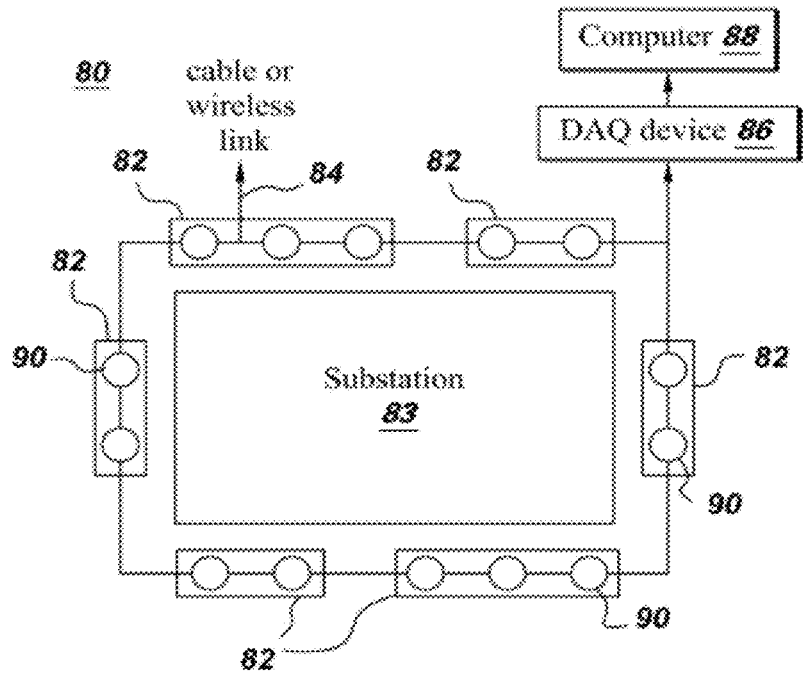
FIG. 3 is a diagrammatical representation of a centralized electrical substation fault monitoring and diagnostic system in accordance with an embodiment of the present invention.

FIG. 3 shows a centralized system 80 for an electrical substation fault monitoring and diagnostic in accordance with an embodiment of the present invention. System 80 includes acoustic sensor arrays 82 placed around a substation 83. As previously described, the acoustic sensor arrays may comprise an array of microphones 90 or any other acoustic sensors that detect acoustic pressure waves. The acoustic sensors may be powered locally (e.g., solar cell with batteries) or via a wired power supply. In one embodiment, a single data acquisition (DAQ) system 86 may be used to digitize measurements from all the microphones. In another embodiment, a dedicated DAQ (not shown) may be utilized for each microphone array. In the former case, a cable or wireless link 84 transmits data from acoustic sensor arrays to the data acquisition (DAQ) system 86, and in the latter case, the cable or the wireless link transmits data from each acoustic sensor array to a processing circuitry 88. Further, the cable 84 may be a regular power cable or a fiber optic cable. The processing circuitry 88 then analyzes the data from the DAQ system 86 and identifies whether there is any fault in substation 83 or not, and which component is the most likely origin of the fault. The processing steps of the processing circuitry 88 will be described in more detail in following paragraphs. In one embodiment, system 80 may also include an alerting device to alert a remote monitoring center (not shown) when specific faults occur. In this case, the system 80 sends the relevant portions of the acoustic measurements to the remote center for review before further actions are taken in an attempt to further reduce the false alarm rate. The acoustic pressure waves detected by sensor arrays 82 and processed by the processing circuitry 88 may include any normal or abnormal sound from the substation assets. The normal sound may be caused by some events such as a tap change of a transformer and the abnormal sound may be caused by faults such as a mechanical breakdown in a component or because of a loose wire within the substation. Some other examples of abnormal sound are corona discharge, current leakages, broken porcelain in the bushings, etc. In some embodiments, abnormal sound may also be a sound from intruders.

Figure 4:
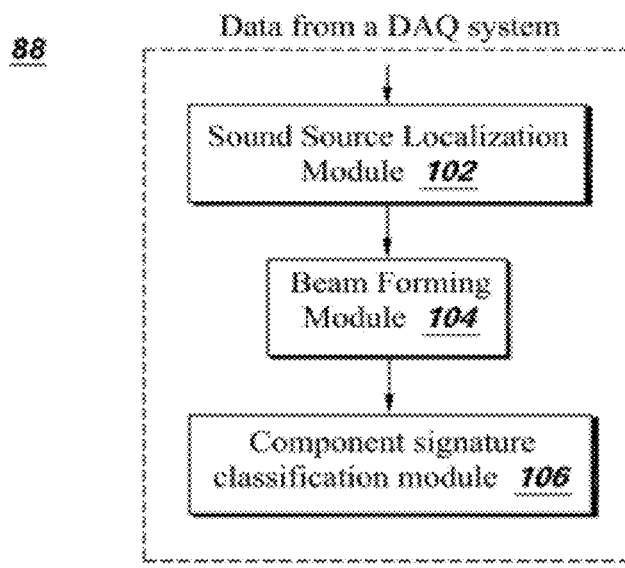
FIG. 4 is a block diagram of a processing circuitry in accordance with an embodiment of the present invention.

FIG. 4 shows a detailed block diagram of the processing circuitry 88 of FIG. 3 in accordance with an embodiment of the present invention. The processing circuitry includes a sound source localization module 102, a beamforming module 104, and a component signature identification module 106. It should be noted that as used herein, the term 'module' may refer to software, or hardware, or firmware, or any combination of these, or any system, process, or functionality that performs or facilitates the processes described herein. The processing circuitry 88 may also include other components such as electronic circuitry and memory which are not shown here. The sound source localization module 102 receives data from the DAQ system (86 of FIG. 3) and processes that data to estimate a spatial origin or source of a component sound. The component sound may be a sound which is of interest to the user. For example, in one embodiment, the component sound may be a sound above a certain frequency. In one embodiment, the sound source localization module 102 identifies the spatial origin based on a time difference of arrival. In this method the same acoustic pressure wave from different acoustic sensors are compared based on their time of arrival. Since the sound source location will be at a different distance from different acoustic sensors, the same acoustic pressure waves will reach different acoustic sensors at different times. Thus, based on the time difference between the arrival times of a specific acoustic pressure wave at various acoustic sensors the location area or the spatial origin of the source is identified. Other methods of localizing the sound source may include subspace based adaptive, super-resolution localization methods such as multiple signal classification (MUSIC), estimation of signal parameters via rotational invariance techniques (ESPRIT) and triangulation. The source localization module may also identify the sound origin based on the spectral contents of the signals in addition to the spatial information. For example, generally a sound or a noise emanating from a particular asset in the substation has a certain frequency range. Thus, if the acoustic pressure waves obtained from the DAQ system fall in that range then it can be identified that the noise is coming from that particular asset or the area where that asset is located. In one embodiment, this method is utilized to reinforce the time difference of arrival based location estimation.

Once the sound source area or the spatial origin of the sound is identified, the beamforming module 104 processes acoustic pressure waves from acoustic sensors for reducing background contamination noise and sound from other areas and consequently reduces false alarm rates. The background contamination noise may include nearby traffic or machinery noise, for example. In general, the maximum number of microphones whose data can be processed by the beamforming module 104 would be limited by the capabilities of the DAQ and the processor. Thus, the sound source localization module 102 estimates the sound source location area of the desired signal and then beamforming module 104 extracts acoustic activity only within that particular location area. The beamforming module 104 may utilize algorithms such as delay- and sum beamforming, Linearly-Constrained Minimum-Variance (LCMV) beamforming, Time-Domain Generalized Sidelobe Canceller (TD-GSC), Frequency-Domain Generalized Sidelobe Canceller (FD-GSC), and Robust Generalized Sidelobe Canceller (R-GSC) algorithm. Based on these algorithms beamforming module 104, removes background noise and other interfering noise, and enhances the acoustic pressure wave of interest.

Component signature classification module 106 then classifies enhanced acoustic pressure waves from beamforming module 104 into various types of events to identify faults in substation assets. In one embodiment, received signals from beamforming module 104 are compared with component signatures in a database to classify them into various events. The events may include normal events such as a tap change of a transformer and abnormal events such as faults. The component signatures may be predetermined and stored in a database based on prior investigation on individual assets and may further be augmented in real time as new type of faults are detected. Classification module 106 may include neural networks, support vector machines, decision trees or maximum entropy classifier to classify the enhanced acoustic pressure waves. In one embodiment, the fault detection may further be enhanced or made more accurate by utilizing information from other sensors such as specialized sensors used for individual apparatuses or faults.

Figure 5:
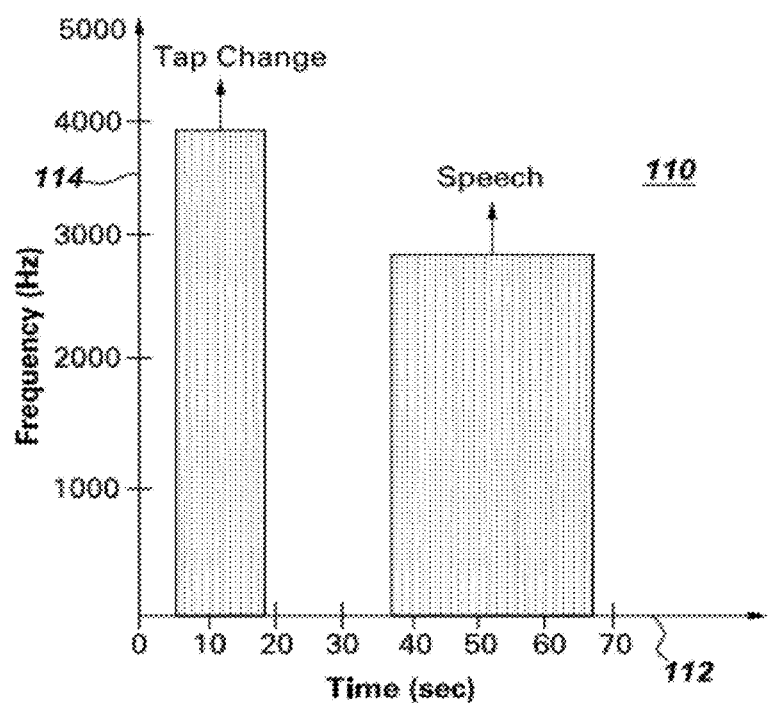
FIG. 5 is a spectrogram of an acoustic sensor.

FIG. 5 shows a spectrogram 110 from an acoustic sensor placed near a substation. Horizontal axis 112 of spectrogram 110 represents time in seconds and vertical axis 114 represents sound frequency in Hz. As can be seen from spectrogram 110, from 5 seconds to 20 seconds a sound with spectral content up to a frequency of 3500 Hz was detected. If this frequency information is compared with component signatures stored in the database, it can then be identified that this sound corresponds to a tap change of a transformer. Similarly, the sound from 35 seconds to 65 seconds has a frequency content of up to around 3000 Hz with some unique characteristics of human speech which can be verified from the component signature or artifact database. The unique characteristics may include shape of the waveform which is not shown here.

Figure 6:
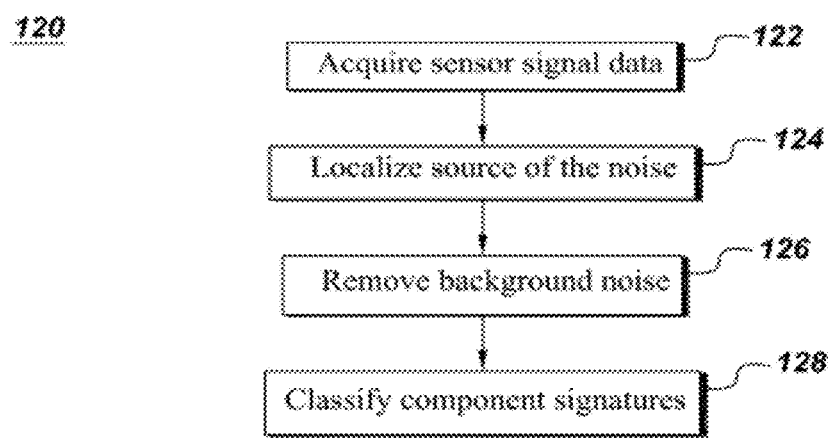
FIG. 6 is a flowchart representing a method of monitoring and diagnosing faults in an electrical substation in accordance with an embodiment of the present invention.

FIG. 6 shows a flowchart 120 representing a method for monitoring and diagnosing faults in a substation. At step 122, signal data from arrays of acoustic sensors are acquired. The arrays may be placed uniformly all around the substation boundary. At step 124, the area of the sound source is localized. Localizing the sound source may be based the time difference of arrival at the sensors. Other methods of localizing the sound source may include subspace based adaptive (i.e., data-dependent), super-resolution localization methods such as MUSIC, ESPRIT and triangulation. At step 126, a beamforming algorithm may be used to remove background noise (e.g., traffic noise) and other interfering noises, such as transformer humming noise or noise from the area other than sound source, in order to enhance the noise from the sound source area. The beamforming algorithm may include delay- and sum beamforming, Linearly-Constrained Minimum-Variance (LCMV) beamforming, Time-Domain Generalized Sidelobe Canceller (TD-GSC), Frequency-Domain Generalized Sidelobe Canceller (FD-GSC), and Robust Generalized Sidelobe Canceller (R-GSC). Once the background noise is removed, at step 128 the resulting enhanced acoustic pressure waves are classified into various events such as normal activities of the assets and faults. In one embodiment, the classification may be done by comparing enhanced acoustic pressure waves with component signatures stored in a database have been predetermined.

One of the advantages of the presented system is it can detect a diversity of faults. Further, the system utilizes acoustic sensors which are easy to install, have low power requirements, low costs, and high versatility (e.g., directional vs. non-directional, different frequency ranges, different sound level ranges, etc.). Also, the sensors utilized are very small and can be deployed without interrupting normal substation operation. Moreover, the system does not require the sensors to be surface-mounted on each substation component, thus providing centralized remote monitoring and diagnostics for the complete substation, further reducing operating costs and increasing electrical safety.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A fault monitoring system for an electrical substation comprising:
    a plurality of acoustic sensors placed around a substation area boundary and configured to measure acoustic pressure waves;
    processing circuitry configured to localize and identify faults in the substation, wherein the processing circuitry comprises:
        a sound source localization module to identify an area of a sound source based on the acoustic pressure waves;
        a beamforming module to provide enhanced acoustic pressure waves by eliminating at least one of a background noise and an interfering noise from the acoustic pressure waves; and
        a component signature classification module to compare enhanced acoustic pressure waves with component signatures to classify the acoustic pressure waves into various events to detect faults in the electrical substation.

2. The fault monitoring system of claim 1, wherein the acoustic sensors comprise microphones.

3. The fault monitoring system of claim 1, wherein the substation boundary comprises an overall substation area boundary or the boundary formed by substation assets.

4. The fault monitoring system of claim 1, wherein the sound source localization module identifies the area of the sound source based on a time difference of arrival of a common acoustic pressure wave at at least two acoustic sensors.

5. The fault monitoring system of claim 1, wherein the sound source localization module comprises one of a subspace based adaptive localization algorithm, or a triangulation algorithm to identify the area of the sound source.

6. The fault monitoring system of claim 1, wherein the interfering noise comprises acoustic pressure waves from areas other than the area of the sound source.

7. The fault monitoring system of claim 1, wherein the beamforming module comprises one of a delay- and sum beamforming algorithm, Linearly-Constrained Minimum-Variance (LCMV) beamforming algorithm, Time-Domain Generalized Sidelobe Canceller (TD-GSC) algorithm, Frequency-Domain Generalized Sidelobe Canceller (FD-GSC) algorithm, or Robust Generalized Sidelobe Canceller (R-GSC) algorithm.

8. The fault monitoring system of claim 1, wherein the component signature classification module classifies acoustics pressure wave signatures into normal and abnormal events.

9. The fault monitoring system of claim 8, wherein the component signatures comprise wave shapes of normal and abnormal events.

10. The fault monitoring system of claim 1, wherein the component signatures may be stored in a database.

11. The fault monitoring system of claim 10, wherein the component signatures comprise predetermined event signatures, the predetermined event signatures being based on prior investigation and analysis of individual apparatuses in the electrical substation.

12. The fault monitoring system of claim 10, wherein the component signatures are augmented in real time when new types of faults are detected.

13. The fault monitoring system of claim 1, wherein the sound source localization module identifies the area of the sound source based on spatial information and spectral contents of acoustic sensors signals.

14. The fault monitoring system of claim 1 further comprises individual sensors on individual apparatuses for enhancing detection of faults.

15. The fault monitoring system of claim 1 further comprising an alerting device to alert a remote monitoring center when a specific fault occurs.

16. The fault monitoring system of claim 1 wherein, in comparing the enhanced acoustic pressure waves with component signatures, the component signature classification module compares a frequency of the enhanced acoustic pressure waves with component signatures.

17. A method for monitoring faults in an electrical substation comprising:
   acquiring acoustic pressure waves from acoustic sensor arrays placed around a substation area boundary;
   localizing an area of a sound source based on a localization algorithm;
   removing at least one of a background noise and an interfering noise from the acoustic pressure waves and generating enhanced acoustic pressure waves based on a beamforming algorithm;
   comparing at least one of a frequency and a waveform shape of the enhanced acoustic pressure waves with component signatures; and
   classifying enhanced acoustic pressure waves into various events based on the comparison of the enhanced acoustic pressure waves with the component signatures, so as to provide for a fault detection in the electrical substation.

18. The method of claim 17, wherein the substation boundary comprises an overall substation area boundary or the boundary formed by substation assets.

19. The method of claim 17, wherein the localization algorithm is based on a time difference of arrival of a common acoustic pressure wave at, at least two acoustic sensors.

20. The method of claim 17, wherein the localization algorithm comprises one of a subspace based adaptive localization algorithm, or a triangulation algorithm.

21. The method of claim 17, wherein the beamforming algorithm comprises one of a delay- and sum beamforming algorithm, Linearly-Constrained Minimum-Variance (LCMV) beamforming algorithm, Time-Domain Generalized Sidelobe Canceller (TD-GSC) algorithm, Frequency-Domain Generalized Sidelobe Canceller (FD-GSC) algorithm, Robust Generalized Sidelobe Canceller (R-GSC) algorithm.

22. The method of claim 17, wherein the component signatures comprise wave shapes of normal and abnormal events.

23. A fault monitoring system for an electrical substation comprising:
   a plurality of acoustic sensors placed around a substation and configured to measure acoustic pressure waves;
   processing circuitry configured to localize and identify faults in the substation, wherein the processing circuitry comprises:
      a sound source localization module to identify an area of a sound source based on the acoustic pressure waves;
      a beamforming module to provide enhanced acoustic pressure waves by eliminating one or more of a background noise and an interfering noise from the acoustic pressure waves; and
      a component signature classification module to compare the enhanced acoustic pressure waves with component signatures to classify the acoustic pressure waves into various events to detect faults in the electrical substation;
      wherein, in comparing the enhanced acoustic pressure waves with component signatures, the component signature classification module compares a frequency of the enhanced acoustic pressure waves with component signatures.

24. The fault monitoring system of claim 23 wherein, in comparing the frequency of the enhanced acoustic pressure waves with component signatures, the component signature classification module compares an instantaneous frequency of the enhanced acoustic pressure waves with component signatures.

* * * * *